(12) United States Patent
Theil et al.

(10) Patent No.: US 6,384,460 B1
(45) Date of Patent: May 7, 2002

(54) SELF-ALIGNED METAL ELECTRODE STRUCTURE FOR ELEVATED SENSORS

(75) Inventors: Jeremy A. Theil; Min Cao, both of Mountain View, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/326,340

(22) Filed: Jun. 7, 1999

(51) Int. Cl.[7] ............... H01L 31/0376; H01L 31/0224; H01L 31/075; H01L 31/232
(52) U.S. Cl. .................. 257/444; 257/53; 257/226; 257/448; 257/458
(58) Field of Search ............... 257/53, 226, 444, 257/448, 458

(56) References Cited

U.S. PATENT DOCUMENTS

| | | | | |
|---|---|---|---|---|
| 5,936,261 A | * | 8/1999 | Ma et al. ............... | 257/226 |
| 6,018,187 A | * | 1/2000 | Theil et al. ............ | 257/458 |
| 6,051,867 A | * | 4/2000 | Theil et al. ............ | 257/444 |

* cited by examiner

Primary Examiner—Gene M. Munson
(74) Attorney, Agent, or Firm—Ronald Hudgens

(57) ABSTRACT

A self-aligned metal electrode sensor structure. The self-aligned metal electrode sensor structure includes a substrate which includes electronic circuitry. An interconnect structure is formed adjacent to the substrate. The interconnect structure includes conductive interconnect vias which pass through the interconnect structure. A sensor is formed adjacent to the interconnect structure. The sensor includes a pixel metallization section and a doped layer electrode. The pixel metallization section is electrically connected to the interconnect via. The pixel metallization section includes an outer surface which is substantially planar. The doped layer electrode includes an inner surface adjacent to the outer surface of the pixel metallization section. The entire inner surface of the doped layer electrode is substantially planar. A transparent conductive layer is formed adjacent to the sensor. The interconnect via and the transparent conductive layer electrically connect the electronic circuitry to the sensor. An embodiment includes the outer surface of the pixel metallization section having an outer surface area which is substantially equal to an inner surface area of the inner surface of the doped layer electrode. Another embodiment includes the outer surface of the pixel metallization section having an outer surface area which is less than an inner surface area of the inner surface of the doped layer electrode.

1 Claim, 4 Drawing Sheets

SELF-ALIGNED METAL ELECTRODE STRUCTURE FOR ELEVATED SENSORS

FIELD OF INVENTION

This invention relates generally to pixel sensors. More particularly, this invention relates a self-aligned metal electrode structure for elevated sensors.

BACKGROUND

An array of image sensors or light sensitive sensors detect the intensity of light received by the image sensors. The image sensors typically generate electrical signals that have amplitudes that are proportionate to the intensity of the light received by the image sensors. The image sensors can convert an optical image into a set of electronic signals. The electronic signals may represent intensities of colors of light received by the image sensors. The electronic signals can be conditioned and sampled to allow image processing.

Integration of the image sensors with signal processing circuitry is becoming more important because integration enables miniaturization and simplification of imaging systems. Integration of image sensors along with analog and digital signal processing circuitry allows electronic imaging systems to be low cost, compact and require low power consumption.

FIG. 1 shows a portion of a prior art integrated circuit image sensor array. The integrated circuit image sensor array includes a substrate 100. An interconnection structure 120 is formed adjacent to the substrate 100. Pixel metallization layers 130 and doped layers 140 form individual sensor electrodes. The sensor electrodes are electrically connected to the substrate 100 through conductive vias 125 within the interconnection structure 120. The sensors can further include an I-layer 150, an outer electrode layer 160 and a conductive layer 170. Generally, the sensor electrodes form cathodes of the image sensors. The transparent conductor 170 provides biasing of the anodes of the image sensors.

Typically, the interconnection structure 120 is a standard CMOS interconnection structure. The interconnection structure 120 includes the conductive vias 125 which provide electrical connections between the substrate 100 and the sensor electrodes.

The pixel metallization layers 130 should include a thin conductive material. The pixel metallization layers 130 are be optional. However, the pixel metallization layers 130 have a lower resistance than the materials used to form the doped layers 140. Therefore, the pixel metallization layers 130 provide better current collection.

The doped layers 140 are generally formed from a doped semiconductor. The doped semiconductor can be an N-layer of amorphous silicon. The doped layers 140 must be thick enough, and doped heavily enough that the doped layers 140 do not fully deplete when the sensors are biased during operation.

Methods of forming the pixel electrode structure shown in FIG. 1 require two material deposition steps and two material removal steps. That is, the methods require a step for depositing a pixel metallization layer, a step for selectively removing portions of the pixel metallization layer, a step for depositing a doped layer, and a step for selectively removing portions of the doped layer. The two material removal steps require lithographically forming masks according to predetermined patterns. That is, a mask must be lithographically formed before removing a predetermined pattern of the pixel metallization layer, and a mask must be lithographically formed before removing a predetermined pattern of the doped layer.

It is desirable to have a simplified metal sensor electrode structure which requires fewer processing steps to form than present metal sensor electrode structures.

SUMMARY OF THE INVENTION

The present invention is a self-aligned metal electrode structure for elevated sensors. Formation of the self-aligned metal electrode structure requires fewer processing steps than presently existing sensor structures.

A first embodiment of the invention includes a self-aligned metal electrode sensor structure. The self-aligned metal electrode sensor structure includes a substrate which includes electronic circuitry. An interconnect structure is formed adjacent to the substrate. The interconnect structure includes conductive interconnect vias which pass through the interconnect structure. A sensor is formed adjacent to the interconnect structure. The sensor includes a pixel metallization section and a doped layer electrode. The pixel metallization section is electrically connected to the interconnect via. The pixel metallization section includes an outer surface which is substantially planar. The doped layer electrode includes an inner surface adjacent to the outer surface of the pixel metallization section. The entire inner surface of the doped layer electrode is substantially planar. A transparent conductive layer is formed adjacent to the sensor. The interconnect via and the transparent conductive layer electrically connect the electronic circuitry to the sensor.

A second embodiment of the invention is similar to the first embodiment. The second embodiment includes the outer surface of the pixel metallization section having an outer surface area which is substantially equal to an inner surface area of the inner surface of the doped layer electrode.

A third embodiment of the invention is similar to the first embodiment. The third embodiment includes the outer surface of the pixel metallization section having an outer surface area which is less than an inner surface area of the inner surface of the doped layer electrode.

Other aspects and advantages of the present invention will become apparent from the following detailed description, taken in conjunction with the accompanying drawings, illustrating by way of example the principles of the invention.

DETAILED DESCRIPTION

Figure 1:
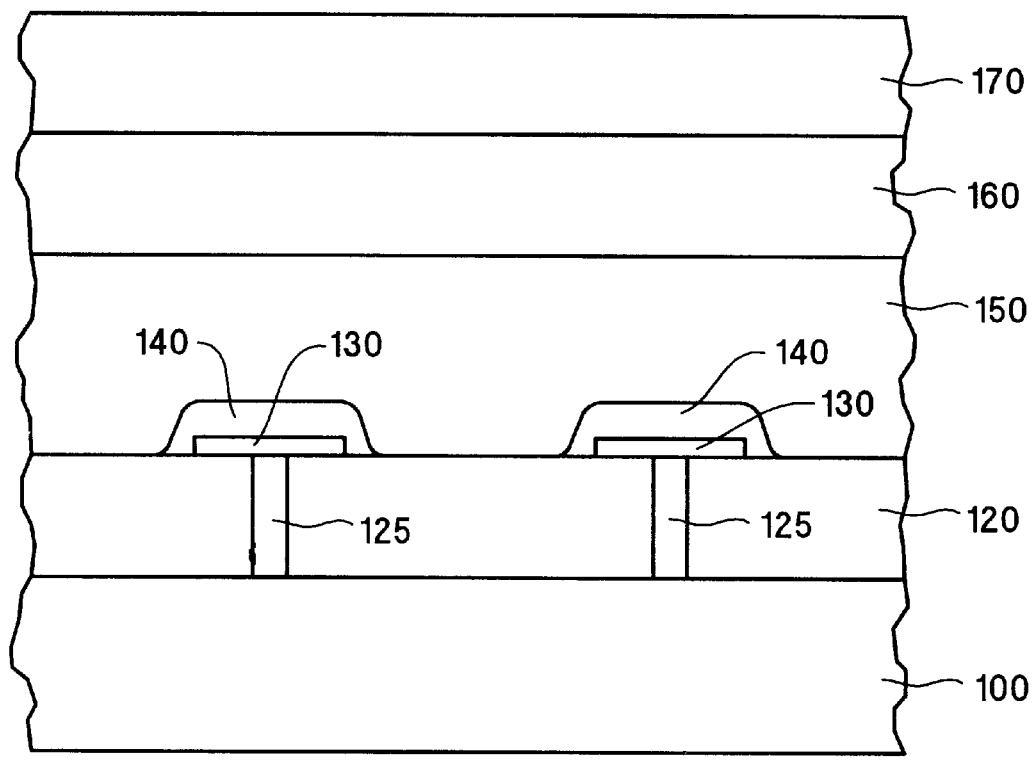
FIG. 1 shows a prior art image sensor array.

As shown in the drawings for purposes of illustration, the invention is embodied in a self-aligned metal electrode structure for elevated sensors. Formation of the self-aligned metal electrode structure requires fewer processing steps than presently existing sensor structures.

Figure 2:
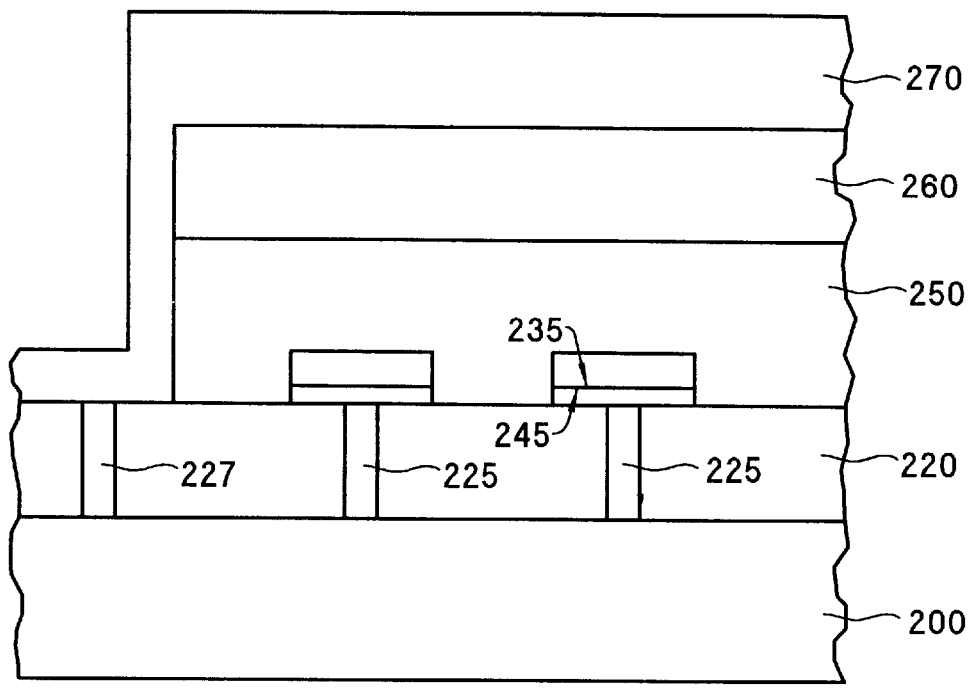
FIG. 2 shows a first embodiment of the invention.

FIG. 2 shows an embodiment of the invention including an integrated circuit and a metal electrode structure. The integrated circuit and metal electrode structure include a substrate 200. The substrate 200 typically includes electronic circuitry. An interconnect structure 220 is formed adjacent to the substrate 200. The interconnect structure 220 includes conductive interconnect vias 225, 227 which pass through the interconnect structure 220. The interconnect vias 225 electrically connect the electronic circuitry of the substrate 200 to an array of image sensors located over the interconnect structure 220.

Electrodes of the array of sensor are formed from pixel metallization sections 230 and doped layer electrodes 240. The pixel metallization sections 230 are each electrically connected to a corresponding interconnect via 225. The doped layer electrodes 240 are formed adjacent to corresponding pixel metallization sections 230. The pixel metallization sections 230 each include an outer surface 235 which is substantially planar.

The doped layer electrodes 240 include an inner surface 245 adjacent to the outer surface 235 of the pixel metallization sections 230. The entire inner surface 245 of the doped layer electrodes 240 are substantially planar.

The embodiment shown in FIG. 2 further includes an I-layer 250 and an outer electrode layer 260.

The pixel metallization sections 230 physically contact the I-layer 250. As a result, some leak age current can occur between the pixel metallization sections 230 and the I-layer 250. The prior art avoided physical contact between the pixel metallization sections and the I-layer because it was believed that the resulting leakage current would be too great. However, it has been experimentally determined that in some applications the leakage current is tolerable.

A transparent conductive layer 270 is formed adjacent to the array of sensors. An inner surface of the transparent conductive layer 270 is electrically connected to the substrate 200 through the interconnect via 227. The interconnect vias 225 and the transparent conductive layer 270 electrically connect the array of sensors to the electronic circuitry of the substrate 200.

The image sensors conduct charge when the image sensors receive light. The substrate 200 generally includes sense circuitry and signal processing circuitry. The sense circuitry senses how much charge the image sensors have conducted. The amount of charge conducted represents the intensity of light received by the image sensors. Generally, the substrate 200 can be CMOS (complementary metal oxide silicon), BiCMOS or Bipolar. The substrate 200 can include various types of substrate technology including charged coupled devices.

Typically, the interconnect structure 220 is a standard interconnection structure. The structure and methods of forming the interconnect structure 220 are well known in the field of electronic integrated circuit fabrication. The interconnect structure 220 can be a subtractive metal structure, or a single or dual damascene structure.

The interconnect structure 220 provides reliability and structural advantages to the elevated image sensor structure. The interconnect structure 220 allows for the formation of thin sensor electrodes because the sensor electrodes are formed over silicon rather that a metal pad. The interconnect structure 220 electrically connects the sensor electrodes to the substrate 100. The interconnect structure 220 is typically formed from a dielectric film, for example, polyimide, silicon oxide or a silicon nitride.

The pixel metallization sections 230 should include a conductive material. The pixel metallization sections 230 may be formed, for example, from a degenerately doped semiconductor layer, aluminum, titanium, titanium nitride, copper or tungsten. The pixel metallization sections 230 should be thin and smooth. The pixel metallization sections 230 should be smooth enough that any surface roughness is substantially less than the thickness of the doped layer electrodes 240 formed over the pixel metallization sections 230. To satisfy the smoothness requirement, polishing of the pixel metallization sections 230 may be required.

The conductive vias 225, 227 pass through the interconnect structure 220 and electrically connect the pixel metallization sections 230 and the transparent conductive layer 270 to the substrate 200. Typically, the conductive vias 225, 227 are formed from tungsten. Tungsten is generally used because tungsten can fill high aspect ratio holes. That is, tungsten can be used to form narrow and relatively long interconnections. Typically, the conductive vias 225, 227 are formed using a chemical vapor deposition (CVD) process. Other materials which can be used to form the conductive vias 225, 227 include copper, aluminum or any other electrically conductive material.

The doped layer electrodes 240 are generally formed from a doped semiconductor. The doped semiconductor can be an N-layer of amorphous silicon. The doped layer electrodes must be thick enough, and doped heavily enough that the doped layer electrodes 240 do not fully deplete when biased during operation. The doped layer electrodes 240 are typically doped with phosphorous.

The doped layer electrodes 240 are typically deposited using plasma etched chemical vapor deposition (PECVD). A silicon containing gas (such as $Si_2H_6$ or $SiH_4$) is included when forming amorphous silicon doped layer electrodes. When forming N-layer doped layer electrodes, the PECVD process is performed with a phosphorous containing gas (such as $PH_3$)

An N-layer of amorphous silicon is typically used when forming PIN diode image sensors. However, the diode image sensors can include an NIP sensor configuration. In this case, the doped layer electrodes 240 are formed from a P-layer, and the outer electrode layer 260 of FIG. 2 are replaced with an N-layer.

The I-layer 250 is generally formed from hydrogenated amorphous silicon. The I-layer 250 can be deposited using a PECVD process or a reactive sputtering process. The PECVD process must include a silicon containing gas. The deposition should be at a low enough temperature that hydrogen is retained within the film. The I-layer 250 is typically on the order of one micron thick.

The outer electrode layer 260 is generally formed from amorphous silicon. Typically, the outer electrode layer 260 is doped with Boron.

The outer electrode layer 260 can deposited using a PECVD process. The PECVD process is performed with a Boron containing gas. The Boron containing gas can be $B_2H_6$. A silicon containing gas is included when forming amorphous silicon outer electrode layer 260. The thickness of the outer electrode layer 260 must generally be controlled to ensure that the outer electrode layer 260 do not absorb too much short wavelength (blue) light.

Another embodiment of the invention does not include outer electrode layer 260. The outer electrode layer 260 can be eliminated with proper selection of the composition of the material within the transparent conductive layer 270, and proper selection of the doping levels of the doped layer electrodes 240. For this embodiment, the transparent conductive layer 270 provides a conductive connection between a top surface of the I-layer 250 of the image sensors and the interconnection structure 220.

As previously described, the doped layer electrodes 240, the I-layer 250 and the outer electrode layer 260 are generally formed from amorphous silicon. However, the doped layer electrodes 240, the I-layer 250 and the outer electrode layer 260 can also be formed from amorphous carbon, amorphous silicon carbide, amorphous germanium, or amorphous silicon-germanium. It should be understood that this list is not exhaustive.

The transparent conductive layer 270 provides a conductive connection between the outer electrode layer 260 and the interconnect structure 220. Light must pass through the transparent conductive layer 270 which is received by the image sensors. Generally, the transparent conductive layer 270 is formed from an indium tin oxide. However, the transparent conductive layer 270 can also be formed from titanium nitride, thin silicide, or certain types of transition metal nitrides or oxides.

Both the selection of the type of material to be used within the transparent conductive layer 270, and the determination of the desired thickness of the transparent conductive layer 270, are based upon minimizing the optical reflection of light received by the image sensor. Minimization of the reflection of light received by the image sensor helps to optimize the amount of light detected by the image sensor.

The transparent conductive layer 270 can be deposited by a sputtering process. Deposition through sputtering is well known in the art of integrated circuit fabrication.

A protective layer may be formed over the transparent conductive layer 270. The protective layer provides mechanical protection, electrical insulation, and can provide some anti-reflective characteristics.

Figure 3:
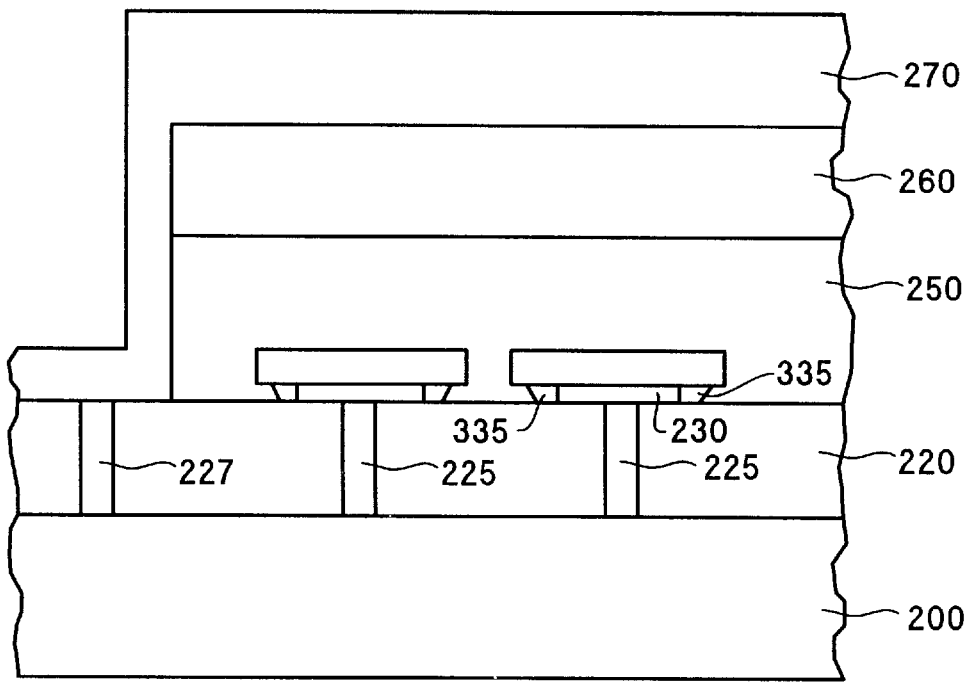
FIG. 3 shows a second embodiment of the invention.

FIG. 3 shows another embodiment of the invention. This embodiment further includes edges of the pixel metallization sections 230 being recessed. The recessed portions provide gaps 335 between the pixel metallization sections 230 and the I-layer 250. The gaps 335 provide insulation between the pixel metallization sections 230 and the I-layer 250. The insulation provided by the gap 335 reduces or eliminates leakage current between the pixel metallization sections 230 and the I-layer 250.

As will be described, the formation of the embodiments of FIG. 2 and FIG. 3 only require a single lithographically patterned mask. Therefore, the embodiments of FIG. 2 and FIG. 3 are easier to form than the prior art structures which required two lithographically patterned masks.

FIG. 4 through FIG. 7 shows steps of a method of forming the self-aligned metal electrode structures of the invention as shown in FIG. 2 and FIG. 3.

Figure 4:
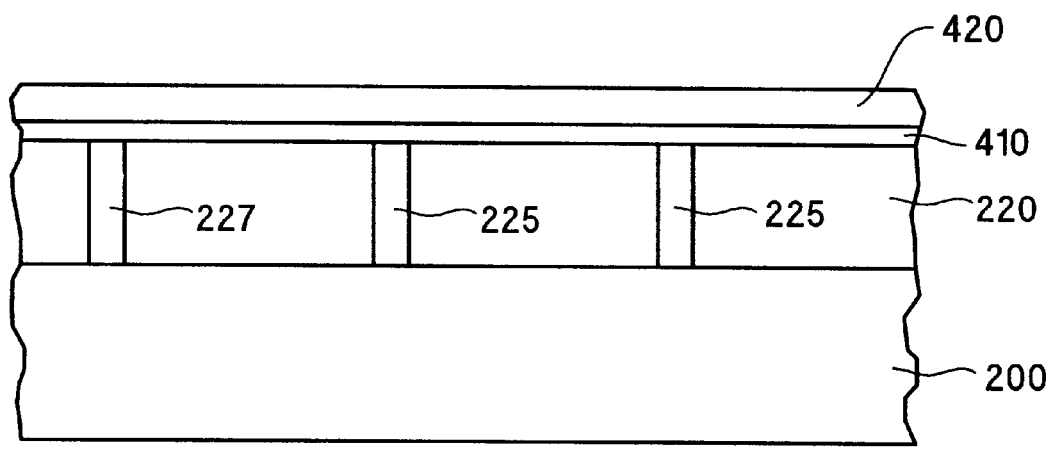
FIG. 4 shows a substrate, an interconnection structure, a pixel metal layer and an electrode layer.

FIG. 4 shows a substrate 200 and an interconnect structure 220 adjacent to the substrate 200. The interconnect structure 220 includes conductive interconnect vias 225, 227 which pass through the interconnect structure 220. A pixel metallization layer 410 has been deposited over the interconnect structure 220, and a doped layer 420 has been deposited over the pixel metallization layer 410.

The structure and methods of forming the interconnection structure 220 are well known in the field of electronic integrated circuit fabrication. The interconnect structure 220 can be a subtractive metal structure, or a single or dual damascene structure. The interconnect structure 220 is typically formed from a silicon oxide or a silicon nitride.

The interconnect structure 220 includes conductive vias 225, 227. Generally, the conductive vias 225, 227 are formed from tungsten. Tungsten is generally used because during fabrication, tungsten can fill high aspect ratio holes. That is, tungsten can be used to form narrow and relatively long interconnections. Typically, the conductive vias 225, 227 are formed using a chemical vapor deposition (CVD) process. Other materials which can be used to form the conductive vias 225, 227 include copper, aluminum or any other electrically conductive material.

The pixel metallization layer 410 is typically deposited by a sputtering process. The pixel metallization layer 410 may be formed, for example, from a degenerately doped semiconductor layer, aluminum, titanium, titanium nitride, copper or tungsten. The pixel metallization layer 410 should be thin (approximately 500 Angstroms) and smooth. To satisfy the smoothness requirement, polishing of the pixel metallization layer 410 may be required.

The doped layer 420 is typically deposited using a PECVD process. The PECVD process is performed with a phosphorous containing gas. The phosphorous containing gas can be $PH_3$. A silicon containing gas, such as $Si_2H_6$ or $SiH_4$, is included when forming amorphous silicon doped layer 420.

Figure 5:
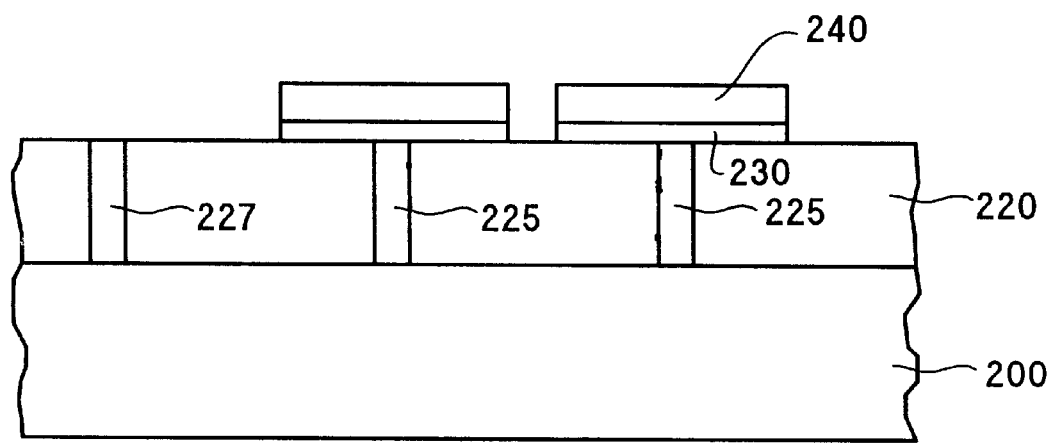
FIG. 5 shows sensor electrodes formed by removing portions of the pixel metal layer and portions of the electrode layer according to a predetermined pattern.

FIG. 5 shows the doped layer 420 and the pixel metallization layer 410 of FIG. 4 having been dry etched to form pixel metallization sections 230 and doped layer electrodes 240. Electrodes of an array of sensor are formed from the pixel metallization sections 230 and doped layer electrodes 240. The pixel metallization sections 230 and doped layer electrodes 240 are formed according to a predetermined pattern. The pattern is formed by depositing a lithographically patterned mask over the doped layer 420. The formation of lithographically patterned masks is well known in the art of semiconductor processing.

The embodiment of FIG. 2 is formed by depositing an I-layer, and outer electrode layer and a transparent conductor layer over the pixel metallization sections 230 and doped layer electrodes 240 of FIG. 5.

Figure 6:
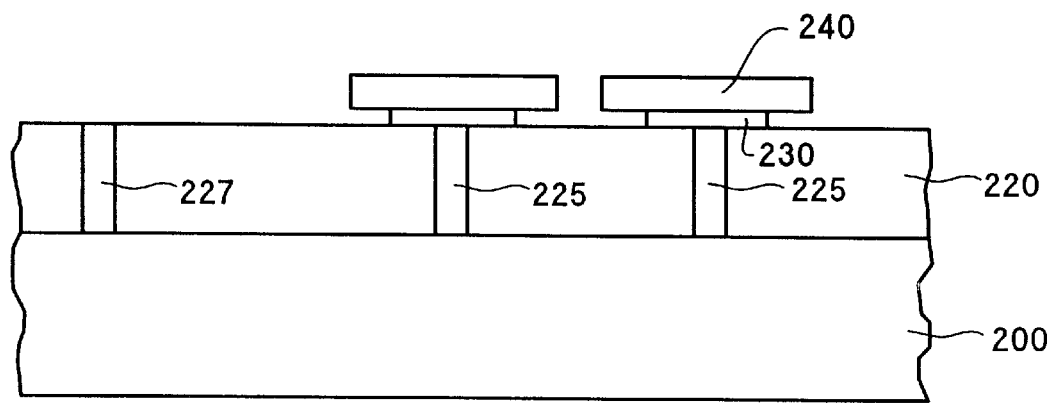
FIG. 6 shows edges of the patterned pixel metal layer having been etched.

FIG. 6 shows edges of the pixel metallization sections 230 having been recessed. The edges of the pixel metallization sections 230 are recessed by wet etching the edges of the pixel metallization sections 230 with a hydrofluoric acid. Wet etching is a process which is well known in the art of semiconductor processing.

Figure 7:
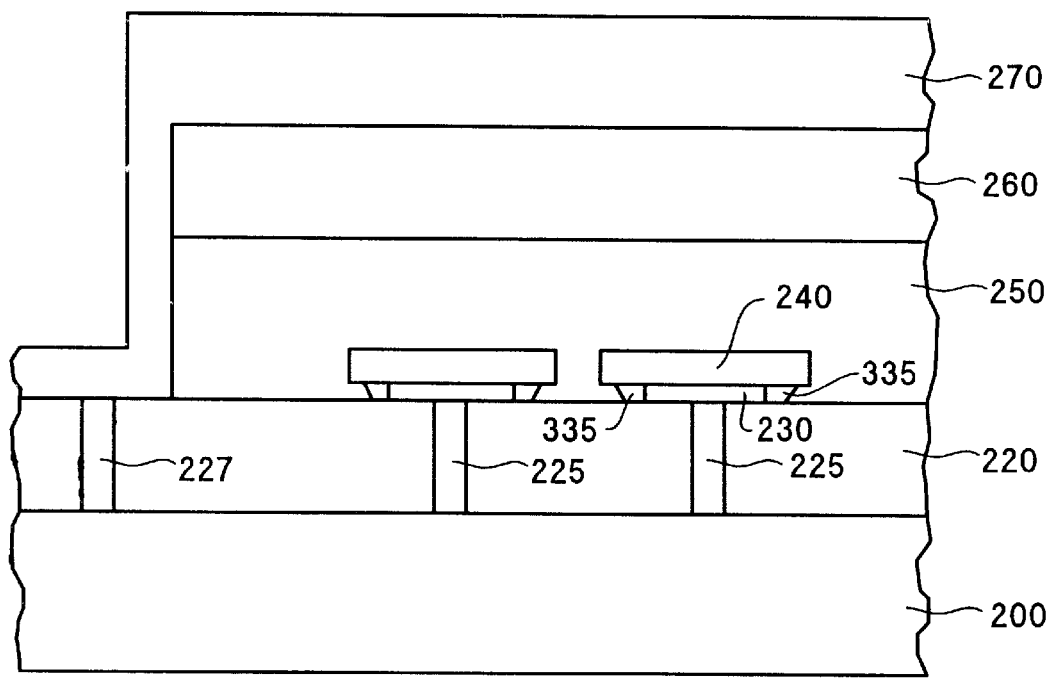
FIG. 7 shows a conductive layer deposited over additional layers required to form an array of image sensors.

FIG. 7 shows the I-layer, the outer electrode layer 260 and the transparent electrode layer 270 having been deposited over the pixel metallization sections 230 and doped layer electrodes 240 of FIG. 6 forming the embodiment shown in FIG. 3.

The I-layer 250 is generally deposited using a PECVD process or reactive sputtering process. The PECVD process must include a silicon containing gas. The deposition should be at a low enough temperature that hydrogen is retained within the film.

The outer electrode layer 260 can also be deposited using a PECVD process. The PECVD process is performed with a Boron containing gas. The Boron containing gas can be $B_2H_6$. A silicon containing gas is included when forming an amorphous silicon outer electrode layer 260.

The outer electrode 260 and the I-layer 250 are etched to provide access to the conductive via 227.

The transparent conductive layer 270 is deposited over the outer electrode layer 260 which provides an electrical connection between the outer electrode layer 260 and the substrate 200 through the conductive via 227. Generally, the transparent conductive layer 270 is formed from an indium tin oxide. However, the transparent conductive layer 270 can also be formed from titanium nitride, thin suicide, or certain types of transition metal nitrides or oxides.

The transparent conductive layer 270 is generally deposited through reactive sputtering. However, the transparent conductive layer 270 can also be grown by evaporation. If the transparent conductive layer 270 is formed from titanium nitride, then typically a CVD process or a sputtering process must be used to deposit the transparent conductive layer 270.

As stated previously, a protective layer may be formed over the transparent conductive layer 270. The protective layer provides mechanical protection, electrical insulation, and can provide some anti-reflective characteristics.

Although specific embodiments of the invention have been described and illustrated, the invention is not to be limited to the specific forms or arrangements of parts so described and illustrated. The invention is limited only by the claims.

What is claimed is:

1. The self-aligned metal electrode sensor structure comprising:

a substrate comprising electronic circuitry;

an interconnect structure adjacent to the substrate, including a conductive interconnect via which passes through the interconnect structure.

a sensor adjacent to the interconnect structure, the sensor comprising, a pixel metallization section electrically connected to the interconnect via, having an outer surface and an outer surface area, and a doped layer electrode, having an inner surface adjacent to the outer surface of the pixel metallization section, the entire inner surface of the doped layer electrode being substantially planar, having an inner surface area of the doped layer electrode that is greater than the outer surface area of the pixel metallization section; and a transparent conductive layer adjacent to the sensor;

wherein the interconnect via and the transparent conductive layer electrically connect the electronic circuitry to the sensor.

* * * * *